United States Patent [19]
Nakahara et al.

[11] Patent Number: 5,743,409
[45] Date of Patent: Apr. 28, 1998

[54] CASE FOR HOUSING A SUBSTRATE

[75] Inventors: Kanefumi Nakahara, Yokohama; Tsuneaki Orikasa, Natori, both of Japan

[73] Assignee: Nikon Corporation, Tokyo, Japan

[21] Appl. No.: 605,835

[22] Filed: Feb. 22, 1996

Related U.S. Application Data

[63] Continuation of Ser. No. 283,518, Aug. 1, 1994, abandoned.

[30] Foreign Application Priority Data

Aug. 12, 1993 [JP] Japan ................................ 5-200808

[51] Int. Cl.$^6$ ................................................ B65D 85/46
[52] U.S. Cl. ........................ 206/710; 206/454; 206/719
[58] Field of Search ............................... 206/454, 449, 206/455, 710, 719, 722

[56] References Cited

U.S. PATENT DOCUMENTS

| | | | |
|---|---|---|---|
| 3,615,006 | 10/1971 | Freed | 206/454 |
| 3,875,012 | 4/1975 | Dorn et al. | 195/127 |
| 4,422,547 | 12/1983 | Abe et al. | 206/328 |
| 4,830,182 | 5/1989 | Nakazato et al. | 206/334 |
| 4,842,136 | 6/1989 | Nakazato et al. | 206/454 |
| 4,848,566 | 7/1989 | Havens et al. | 206/701 |
| 4,899,521 | 2/1990 | Havens | 53/461 |
| 5,001,214 | 3/1991 | White et al. | 528/217 |
| 5,012,926 | 5/1991 | Jamison | 206/334 |
| 5,043,195 | 8/1991 | Skrivseth | 428/35.3 |
| 5,205,406 | 4/1993 | Bradford | 206/328 |
| 5,240,753 | 8/1993 | Tabuchi et al. | 428/36.4 |
| 5,285,895 | 2/1994 | Bolt | 206/334 |
| 5,310,076 | 5/1994 | Burton et al. | 220/377 |
| 5,314,068 | 5/1994 | Nakazato et al. | 206/454 |
| 5,320,225 | 6/1994 | Kirkpatrick | 206/449 |
| 5,353,934 | 10/1994 | Yamauchi | 206/454 |
| 5,415,906 | 5/1995 | Miyakawa et al. | 428/35.7 |
| 5,533,972 | 7/1996 | Gyory et al. | 604/20 |

FOREIGN PATENT DOCUMENTS

| | | |
|---|---|---|
| 63-18734 | 4/1988 | Japan . |
| 1-36255 | 7/1989 | Japan . |

*Primary Examiner*—Paul T. Sewell
*Assistant Examiner*—Nhan T. Lam

[57] ABSTRACT

A case for housing a substrate which limits the accumulation of dust, due to static electricity, while allowing visual access to the substrate. A box-like case portion has an open front end and a front lid pivotally provided on the case portion to close the front end and in which a predetermined substrate is housed in the case portion. A predetermined portion of the box-like case portion and the front lid are made of synthetic resin formed with electrically conductive copolymer. A predetermined position of the box-like case is formed of transparent electrically conductive material.

4 Claims, 3 Drawing Sheets

5,743,409

CASE FOR HOUSING A SUBSTRATE

This application is a continuation of application Ser. No. 08/283,518, filed Aug. 1, 1994, now abandoned.

BACKGROUND OF THE INVENTION

1. Field of the Invention

The present invention relates to a case for housing a substrate such as a photomask, a reticle, a wafer or a glass plate which is used for manufacturing a semiconductor device such as an LSI or a liquid crystal display device.

2. Related Background Art

It is necessary to prevent foreign matter such as dust from attaching to a photomask or a reticle (hereinafter generally referred to as the "reticle") used as an original at an extremely high level, when providing a semiconductor device such as an LSI or a liquid crystal display device. To prevent such contamination, the reticle is housed in a special case. A known case for housing a reticle will be described as an example of the prior art.

As disclosed in Japanese Patent Publication No. 1-36255, U.S. Pat. No. 4,422,547 corresponding thereto or Japanese Patent Publication No. 63-18734, a conventional housing case for a reticle comprises a box-shaped case portion having an open front face and a front lid pivotally provided on the case portion. A reticle is placed in the box-shaped case after the front lid has been opened. The conventional housing case is made of synthetic resin or surface treated metal. In many cases, however, no consideration has been made for prevention of static electricity from being charged on the case. It is known to form a continuous anti-electrostatic layer on the outer surface of the synthetic resin by incorporating a surface active agent into the Synthetic resin or by mixing the synthetic resin with electrically conductive substance such as carbon fiber or carbon powder (carbon particles) so as to give an anti-electrostatic effect to the housing case. It is also known to coat the surface of the housing case with a substance providing an anti-electrostatic effect.

In the conventional art as described above, the housing case is not made of an anti-electrostatic material. When the housing is handled, for example, to be transported or cleaned, under a condition of low humidity in a clean room or the like in which LSIs or the like are manufactured, if the housing case is rubbed against cloth or gloves which are not provided with anti-electrostatic prevention means, the housing is likely to be charged. If a storing shell is charged, the housing case is also likely to be charged by the housing case rubbing the storing shell. The housing case is further likely to be charged due to various other causes.

As the housing case is charged, static electricity is produced also on the surface of the reticle stored in the housing case. Dust is likely to be attached to the charged reticle. Fine patterns formed on the reticle are likely to be destroyed when an excessive static electricity charge is built up.

Where a surface active agent is incorporated into synthetic resin forming the housing case, so as to Give the housing case an anti-electrostatic effect, the anti-electrostatic function of the surface active agent is lowered, during washing, due to the presence of a hydrophilic group in the surface active agent. When an electrically conductive material, such as carbon fiber or carbon powder (carbon particles), is mixed and incorporated, there is an adverse possibility that it is removed, thereby increasing causes of dust generation. In other words, as the reticle and reticle supports contact each other in the housing case and/or moving parts in the housing case are rubbed together, the electrically conductive material is removed from the synthetic resin with which the material has been mixed and becomes dust. The dust is likely to attached to the reticle in the housing case.

When synthetic resin is mixed with an electrically conductive material of a carbon base or a metal base, the synthetic resin is not transparent. Thus, the reticle in the housing case cannot be visually observed. The normal housing case has not only a front lid but also an upper lid which can be opened. Thus, in order to confirm letters, or the like, on the reticle when the housing case, the upper case must be opened. Such a opening operation is inefficient and allows dust to be attached to the reticle.

SUMMARY OF THE INVENTION

An object of the present invention is to give anti-electrostatic effect to a part or the whole of a housing case for housing a reticle, a wafer or the like without losing the dust-proof property which is the inherent function and without creating any new causes of dust generation. It is another object of the present invention is to allow the reticle, the wafer or the like in the housing case to be observed externally thereof.

According to the present invention, there is provided a case for housing a substrate which includes a box-like case portion having an open front face and a front lid pivotally provided on the case portion, for closing the front face and in which a predetermined substrate is housed in the box-like case portion by opening the front lid and at least either one of the box-like case portion and the front lid is made of synthetic resin in which electrically conductive copolymer is formed.

It is preferred that the upper surface of the box-like case portion be made of a transparent conductive material.

It is desirable that fluorine be incorporated in the synthetic resin forming therein electrically conductive copolymer.

According to the present invention, the synthetic resin, of which the predetermined portion of the box-like case having an open front face and/or the front lid is made, does not include a surface active agent or electrically conductive fiber or powder which is of a low molecular type and is not compatible with the synthetic resin. But the synthetic resin is formed with copolymer which a is high molecular type and is compatible with the synthetic resin so that the synthetic resin itself has an anti-electrostatic effect. Thus, dust which otherwise has been generated due to removal of the electrically conductive substance, is not Generated, thereby preventing the synthetic resin from being charged.

When the upper plate portion of the box-shaped case is made of an electrically conductive and transparent synthetic resin, the upper plate portion of the case has electrical conductivity and the state of the reticle or the wafer in the case can be visually observed through the upper plate portion with ease.

In case where fluorine is incorporated in material comprising synthetic resin formed therein with electrically conductive copolymer, abrasion resistance is improved. Even when the reticle or the like contact the material and they are rubbed with each other, little dust is generated.

DETAILED DESCRIPTION OF THE PREFERRED EMBODIMENT

An embodiment according to the present invention will be described with reference to the accompanying drawings. This embodiment is a so-called cassette type case for housing a reticle in accordance with a preferred embodiment of the present invention.

Figure 1:
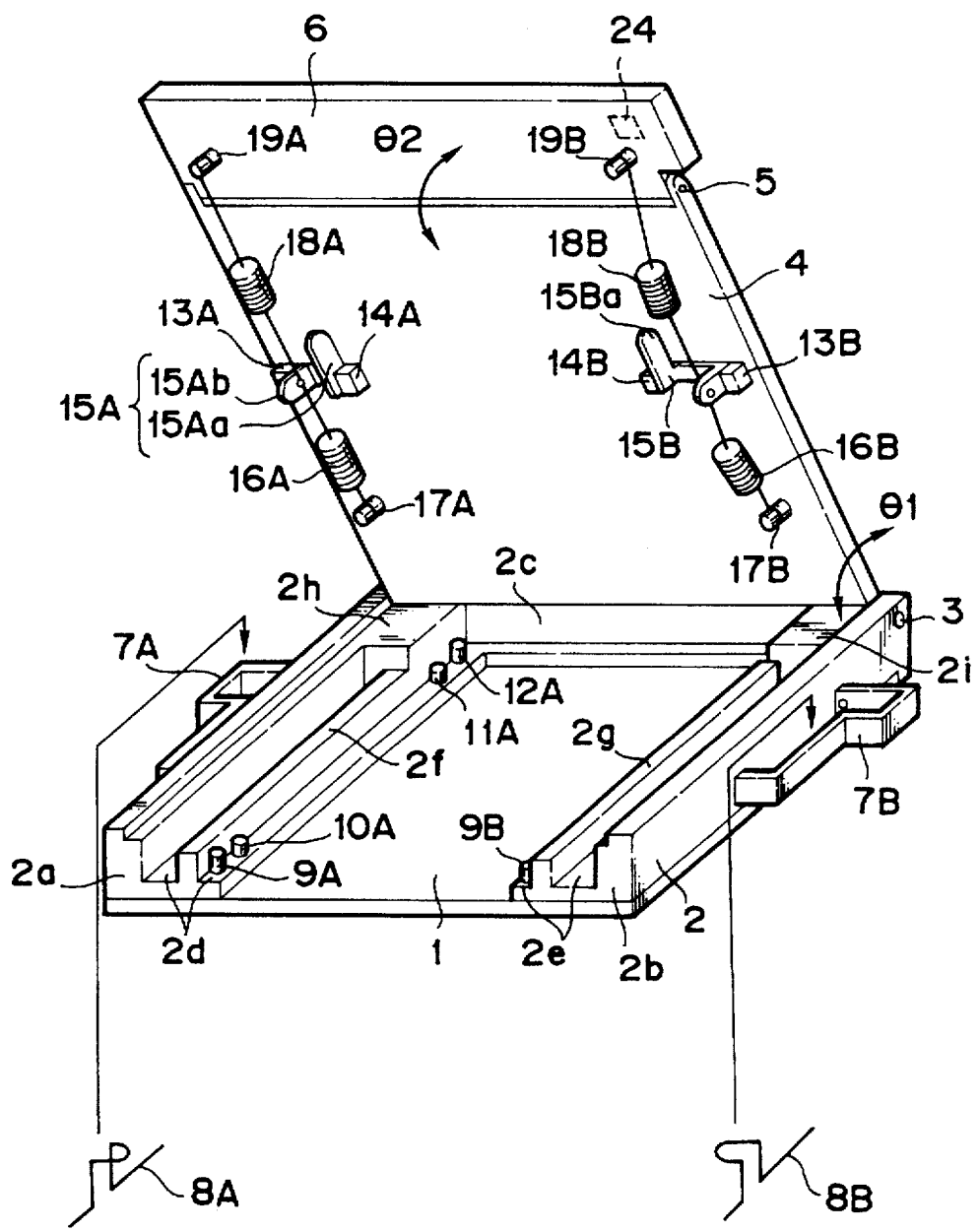
FIG. 1 is a perspective view of one embodiment of a case for housing a substrate with the upper lid opened.

In FIG. 1, the upper lid 4 of the housing case is shown in an open state. A substantially U-shaped side member 2 is fixedly mounted on a rectangular metallic bottom plate 1. The upper lid 4 is pivotally mounted on a rear portion 2c of the side member 2 by a hinge 3. A front lid 6 is pivotally mounted on the front surface of the upper lid 4 by a hinge 5. The side member 2 is connected to the metallic bottom plate 1 by adherence of an electrically conductive adhesive or a screw or the like.

The side member 2 generally comprises the rear portion 2c and a pair of reticle supporting portions 2a and 2b whose corresponding ends sandwich the rear portion 2c. The reticle supporting portions 2a and 2b are formed integrally with the rear portion 2c. A deep groove 2d is formed in the inner side of the left reticle supporting portion 2a. A ridge 2f is formed on the longitudinal central portion of the deep groove 2d. A shallow stepped portion 2h, with which the upper lid 4 is closely contacted, is formed so as to surround the deep groove 2d. A pair of long pin-like stoppers 9A and 12A are integrally formed on the inside portion of the deep groove 2d with respect to the ridge 2f. A pair of short reticle supporting pins 10A and 11A are also integrally formed between the stoppers 9A and 12A. The bottom plate 1, the side member 2 and the hinge 3 constitute a case portion having an open front face.

The right reticle supporting portion 2b is also provided with a deep groove 2e, a ridge 2g and a shallow stepped portion 2i with which the upper lid 4 is closely contacted. The deep groove 2e, the ridge 2g and the shallow stepped portion 2i are arranged symmetrically with the corresponding portions of the left reticle supporting portion 2a. Stoppers 9B and 12B are integrally formed on the inside of the deep groove 2e with respect to the ridge 2g, and reticle supporting pins 10B and 11B are integrally formed between the stoppers 9B and (only the stopper 9B is shown in FIG. 1.

Figure 2:
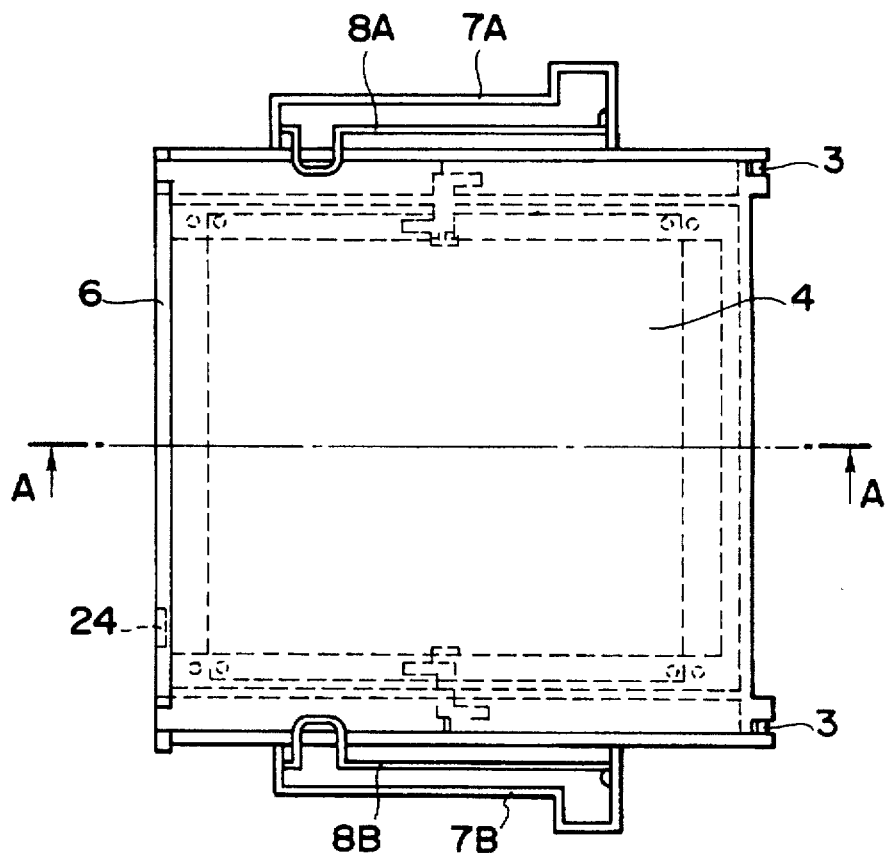
FIG. 2 is a plan view of the housing case of FIG. 1 with the upper lid closed.

A pair of guide portions 7A and 7B are integrally formed on the outer surfaces of the reticle supporting portions 2a and 2b, respectively. A pair of holding springs 8A and 8B are inserted in the guide portions 7A and 7B with the upper lid 4 closely contacted with the stepped portions 2h and 2i so that the holding springs 8A and 8B urge the upper lid 4 downward, i.e., toward the side member 2 so as to fix the upper lid 4 to the side member 2. FIG. 2 is a plan view showing the state in which the upper lid 4 is pressed against the side member 2. As shown in FIG. 2, the upper lid 4 is pressed and held by the arcuated portions of the holding springs 8A and 8B. The holding springs 8A and 8B need be merely disengaged from the guide portions 7A and 7B so as to rotate the upper lid 4 around the hinge 3 and open it. The guide portions 7A and 7B are used as guides when the holding case is transported to the storing shell or therefrom. The holding springs 8A and 8B are formed by bending metallic wires such as piano wires.

Referring to FIG. 1 again, a pair of bearing portions 13A and 14A are formed, integral with each other, on the central portion of the left side of the undersurface of the upper lid 4. A reticle holder 15A is rotatably provided between the bearing portions 13A and 13B. The reticle holder 15A comprises a long holding portion 15Aa and a small spring engaging portion 15Ab twisted at right angles from the holding portion 15Aa and formed integrally therewith. A spring hook portion 17A is formed on a portion of the undersurface of the upper lid 4, at the side the hinge 3 is connected to the spring engaging portion 15Ab by an extension coil spring 16A. A spring hook portion 19A, formed integrally on the inner surface of the front lid 6, is connected to the spring engaging portion 15Ab by an extension coil spring 18A.

On the right side of the undersurface of the upper lid 4, integrally formed bearing portions 13B and 14B are provided. A rotatable reticle holder 15B disposed between the bearing portions 13B and 14B. A spring hook portion 17B and a reticle holder 15B, formed on the undersurface of the upper lid 4, are connected together by an extension coil spring 18B. When the front lid 6 is rotated, in one of the direction θ2 around the hinge 5 and is opened, the reticle holders 15A and 15B are rotated by the action of the extension coil springs 16A, 16B, 18A and 18B, and the holding portions 15Aa and 15Ba are set substantially parallel with the upper lid 4. On the other hand, when the upper lid 4 is rotated in the opposite direction and is closed, the holding portions 15Aa and 15Ba of the reticle holders 15A and 15B are rotated so as to be set perpendicularly to the upper lid 4. Thus, the reticle in the holding case can be fixed by the holding portions 15Aa and 15Ba.

Materials, as described below, are used in order to give an anti-electrostatic effect to the housing case shown in FIG. 1. The metallic bottom plate 1 generally comprises an aluminum substrate plated with nickel so as to increase the surface hardness and provide electrical conductivity. However, the aluminum substrate may merely be anodized. The bottom plate 1 is made of metal so as to increase the strength of the whole housing case. When the weight is not limited, stainless steel, having an untreated surface, may be used for the bottom plate 1. When the thickness is not limited, the bottom plate 1 may be molded from a synthetic resin so as to be integral with the side member 2.

The side member 2 and the reticle holders 15A and 15B are preferably made of synthetic resin of styrene-denaturalized PPE (polyphenylene ether) in which block copolymer of polyether and polyamide is formed so as to provide an anti-electrostatic effect. Polycarbonate and the like can be used instead of the denaturalized PPE. The block polymer is preferably a high molecular polymer having electrical conductivity. The block polymer is preferably compatible with the synthetic resin and has higher resistance to solvents than low molecular polymer such as a surface active agent. In accordance with the preferred embodiment the side member 2 is light in weight and has some degree of electrical conductivity, and it is accordingly provided with an anti-electrostatic effect. Since electrically conductive copolymer is formed in synthetic resin, the electrically conductive copolymer is not removed, to become dust, even if the reticle contacts the side member 2 or the side member 2 and/or the reticle holders 15A and 15B rub together.

In general the upper limit of the specific surface resistance [Ω] of a material which can be prevented from being charged in a dynamic state is the order of $10^{10}$ to $10^{12}$ Ω. The specific surface resistance of a packing material provided with an anti-electrostatic effect, for packing an IC, an LSI or the like is the order of $10^8$ to $10^9$ Ω. The specific surface resistance of the side member 2 made of denaturalized PPE formed therein with block copolymer of polyether and polyamide in this embodiment is the order of $10^9$ Ω, and thus it has a sufficient anti-electrostatic effect. In experiments in which the side member 2 was set at a temperature of 23° C. in an extremely dry atmosphere of humidity of 35%, the specific surface resistance of the holding case in accordance with the preferred embodiment of the present invention was the order of $10^{10}$ Ω and a sufficient anti-electrostatic effect was obtained. On the contrary, it is known that a material formed by incorporating a low molecular surface active agent in synthetic resin in a conventional way has an extremely high specific surface resistance at humidity of 35% and has little anti-electrostatic effect. Thus, the side member 2 made of the material of this embodiment provides a sufficient anti-electrostatic effect, even in an extremely dry atmosphere.

Fluorine may be incorporated in a synthetic resin, whose base is the denaturalized PPE or the like, to increase abrasion resistance and sliding property of the side member 2 and the reticle holders 15A and 15B.

In order to obtain anti-electrostatic effect and transparency, the material of the upper lid 4 is a resin preferably comprising PMMA (methacrylic resin) as the main component. The resin includes a portion which has a rubber-like internal structure and absorbs and holds water. Thus, the resin is electrically conductive, although it is transparent, because it contains water. The specific surface resistance of the upper lid 4 made of such material is the order of $10^{11}$ to $10^{12}$ Ω so that it provides a sufficient anti-electrostatic effect.

The front lid 6 may be made of either a resin, comprising PMMA as the main component, having a rubber-like internal structure and absorbing and holding water, like the material of the upper lid 4, or a resin comprising denaturalized PPE formed with electrically conductive copolymer formed in denaturalized PPE, like the material of the side member 2. When, however, it is required that a reticle and pellicles (which will be described later) in the housing case be visually observed from the front side, the front lid 6 may be made of the same transparent resin as that of the upper lid 4. Preferably in order to distinguish the housing case according to the present invention from a housing case which does not have an electrostatic effect, a mark 24, comprising a depression or a projection, is formed in or on the outer surface of the front lid 6 of the present invention when the front lid 6 is molded (see FIG. 2).

The whole housing case (i.e., the bottom plate 1, the side member 2, the upper lid 4 and the front lid 6) may be made of resin comprising a denaturalized PPE base formed with electrically conductive copolymer. A transparent window may be formed in a part of the case (a part of the upper lid 4, for example) to visually observe the reticle in the case. A resin comprising PMMA as the principle component and having a rubber-like internal structure can be used as the material of the transparent window. Further, only the portions which slide on the storing shell (the Guide portions 7A and 7B formed on the side member 2, for example) need be made of resin comprising a denaturalized PPE base formed with electrically conductive copolymer. Further, the portions which are held by an operator or a holding apparatus may also be made of resin comprising a denaturalized PPE base formed with electrically conductive copolymer.

Figure 3:
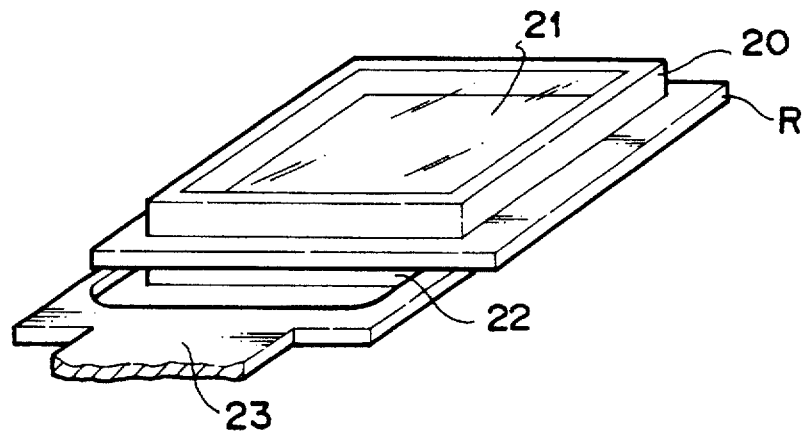
FIG. 3 is a partially broken perspective view which shows the state in which a reticle having pellicles and to be housed in the housing case is being transported.

The operation how of housing a reticle in the holding case in accordance with the preferred embodiment of the present invention will be described. As shown in FIG. 3, a reticle R mounted on an arm 23, for transporting the reticle is brought to the front face of the housing case portion. An extremely thin film (hereinafter referred to as the "pellicle") 21 for preventing attachment of foreign matter such as dust is placed on the upper surface of the glass substrate of the reticle R via a rectangular frame 20. Another pellicle (not shown) is placed on the undersurface (the pattern formed surface) of the glass substrate of the reticle R by means of another rectangular frame 22. The housing case in accordance with the preferred embodiment of the present invention, can store a normal reticle and a reticle R having pellicles formed on both surfaces.

Figure 4A:
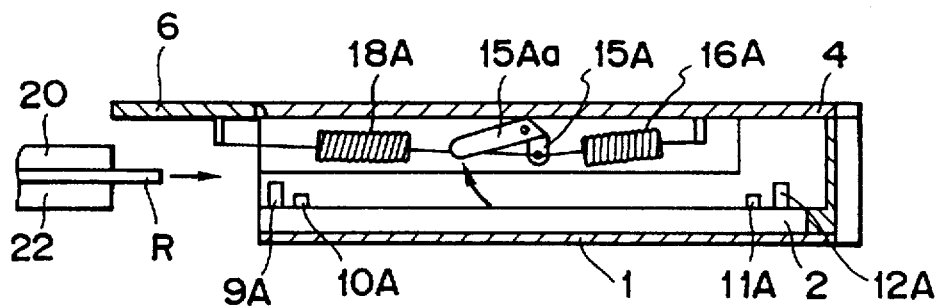
FIG. 4A is a cross-sectional view of the housing case along line A—A of FIG. 2, with the front lid opened.
Figure 4B:
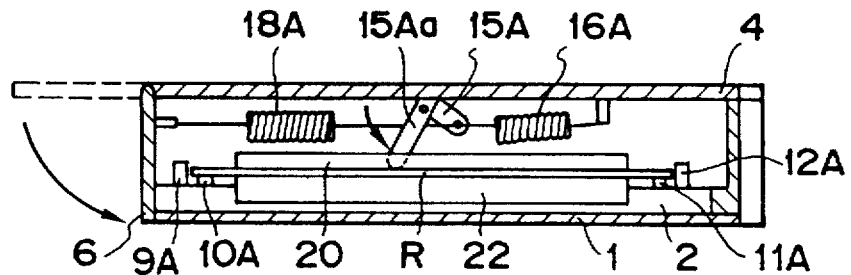
FIG. 4B is a cross-sectional view of the housing case along line A—A of FIG. 2, with the front lid closed and with a reticle housed in the case.

FIGS. 4A and 4B are cross-sectional views along line A—A of the side member 2. As shown in FIG. 4A, the reticle R with the pellicles is put into the housing case portion from its front face in a state in which the front lid 6 is opened. The reticle holder 15A is rotated by the extension coil spring 18A, connected to the front lid 6, and the extension coil spring 16A, connected to the upper lid 4. The holding portion 15Aa is set substantially parallel with the upper lid 4. Thus, the reticle R can be put into the space defined by the bottom plate 1, the side member 2 and the upper lid 4.

Thereafter, as shown in FIG. 4B, the glass substrate of the reticle R is placed with its undersurface of contacted with the two reticle supporting pins 10A and 11A. The glass substrate of the reticle R is also placed on the two reticle supporting pins 10B and 11B (see FIG. 1), which are disposed above the paper surface of FIG. 4B. As the front lid 6 is closed, the holding portion 15Aa of the reticle holder 15A and the holding portion of the reticle holder 15B (FIG. 1) are urged against the upper surface of the Glass substrate of the reticle R, and the reticle R is held stably on the side member 2. The stoppers 9A and 11A are formed on the portions beyond the reticle supporting pins 10A and 11A, and the ridges 2f and 2g are formed on the outside of the reticle supporting pins 10A and 11A, etc. Thus, the position of the reticle R does not deviated during transportation of the reticle R housed in the housing case, and the pellicles placed on the reticle R and the rectangular frame for supporting the pellicles, etc. are not damaged.

As shown in FIG. 4B, the front lid 6 is urged against the front end face of the bottom plate 1 and the front end face of the side member 2 by the extension coil spring 18A. Thus, the housing case is sealed well, and foreign matter such as dust does not attaches to the reticle R housed in the housing case during transportation.

In this embodiment, the present invention is applied to a reticle housing case. However, the present invention is applicable to a case for housing a wafer, a glass plate or the like to which reticle patterns are transcribed. Thus, the present invention is not limited to the above-mentioned embodiment, and is applicable to various modifications which fall in the scope of the present invention.

In the present invention, the material of the predetermined portion of the housing case is not a synthetic resin mixed with electrically conductive fiber and electrically conductive particles, but is a synthetic resin formed with high molecular copolymer which has good electrical conductivity and is compatible with the synthetic resin. It is advantageous, therefore, that a part or the whole of the housing case be provided with an anti-electrostatic effect, without losing dust-proof property, which is the fundamental function and without generating dust which, in the prior art, has been generated due to removal of the incorporated material. As a result, a reticle, a wafer or the like housed in the holding case is prevented from being charged, and attachment of dust due to charging and generation of defects of an LSI due to electrostatic destruction of the pattern are avoided. Further, the anti-electrostatic effect is little lowered in an extremely dry atmosphere.

When the upper surface of the box-like case is made of an electrically conductive and transparent material, the state of the reticle or the wafer in the case can be visually observed externally of the case without loosing dust proof property. Since the state of the interior of the case can be confirmed without opening the front lid or the like, foreign matter such as dust does not enter the case from the outer atmosphere. In case fluorine is incorporated into synthetic resin which has an anti-electrostatic effect, it is advantageous that abrasive resistance and sliding property are improved and little dust is generated upon contact of the reticle, etc. with the housing case.

What is claimed is:

1. A case for housing a substrate comprising:

a housing portion provided with an open front end for receiving a substrate;

a front lid pivotally connected to said case portion, said front lid adapted for closing over the open front end; and predetermined portions of said housing portion and said front lid are made of styrene-denaturalized polyphenylene ether formed with an electrically conductive copolymer comprising polyether and polyamide.

2. A case for housing a substrate, comprising:

a housing provided with an open front end for receiving a substrate;

a lid pivotally connected to the housing so as to allow the lid to open and close over the open front end of the housing; and predetermined portions of the housing and lid being formed of polyphenylene ether containing an electrically conductive copolymer of polyether and polyamide.

3. A case for housing a substrate, comprising:

a housing provided with an open front end portion for receiving a substrate; a lid pivotally connected to the housing allows the lid to open and close over the front end of the housing; and predetermined portions of the housing and lid being formed of polycarbonate containing an electrically conductive copolymer of polyether and polyamide.

4. A case for housing a substrate, comprising:

a housing provided with an open front end for receiving a substrate;

a lid pivotally connected to the housing allow the lid to open and close over the front end of the housing and;

predetermined portions of the housing being formed of polycarbonate containing an electrically conductive copolymer.

* * * * *

UNITED STATES PATENT AND TRADEMARK OFFICE
CERTIFICATE OF CORRECTION

PATENT NO. : 5,743,409
DATED : April 28, 1998
INVENTOR(S) : Kanefumi Nakahara, et al.

It is certified that error appears in the above-identified patent and that said Letters Patent is hereby corrected as shown below:

Column 8, line 14, claim 3, after "substrate;" start new paragraph.

Signed and Sealed this

Fourth Day of August, 1998

Attest:

BRUCE LEHMAN

Attesting Officer

Commissioner of Patents and Trademarks